United States Patent [19]
Furuhata

[11] Patent Number: 5,521,421
[45] Date of Patent: May 28, 1996

[54] SEMICONDUCTOR DEVICE

[75] Inventor: Shoichi Furuhata, Nagano, Japan

[73] Assignee: Fuji Electric Co., Ltd., Hino, Japan

[21] Appl. No.: 294,637

[22] Filed: Aug. 23, 1994

[30] Foreign Application Priority Data

Aug. 23, 1993 [JP] Japan .................................. 5-206772

[51] Int. Cl.⁶ ................................................. H01L 31/058
[52] U.S. Cl. .......................... 257/467; 257/108; 257/469; 257/470; 257/551; 257/360
[58] Field of Search ................................... 257/341, 360, 257/469, 470, 551, 467, 108

[56] References Cited

U.S. PATENT DOCUMENTS

| | | | |
|---|---|---|---|
| 5,097,302 | 3/1992 | Fujihira et al. ........................ | 357/23.4 |
| 5,389,813 | 2/1995 | Schwob .................................. | 257/469 |

OTHER PUBLICATIONS

"Smart–Sipmos—An Intelligent Power Switch" by Glogolja et al.; pp. 429–433, Conf. Rec. IEEE Ind.Appl.Soc. Annu. Meet. Jan. (1986).

"Self–Thermal Protecting Power MOSFET's" by Yamaoka et al.; SAE Technical Paper Series, pp. 41–46; Reprinted from SP–737–Sensors and Actuators—Jan. 1988; Int'l. Congress and Exposition, Detroit, Michigan, Feb. 29–Mar. 4, 1988.

*Primary Examiner*—Edward Wojciechowicz
*Attorney, Agent, or Firm*—Brumbaugh, Graves, Donohue & Raymond

[57] ABSTRACT

In a semiconductor device with a power element on a substrate, a temperature monitor element is formed on the same substrate. In case of thermal overload in the power element, a signal from the temperature monitor element can be used for turning the power element off. For enhanced temperature response, the temperature monitor element is in part surrounded by the power element or/and disposed beneath an integrated, thermally conductive extension of an electrode of the power element.

9 Claims, 4 Drawing Sheets

IC BLOCK (22) | POWER MOSFET BLOCK (21)

IC BLOCK (22) | TEMPERATURE MONITOR ELEMENT (28) | POWER MOSFET BLOCK (21)

SEMICONDUCTOR DEVICE

BACKGROUND OF THE INVENTION

1. Field of the Invention

The present invention relates to a semiconductor device and, more specifically, to a configuration and peripheral structure of a temperature monitor element for monitoring temperature of a power IC device.

2. Description of the Prior Art

Power MOSFETs that are easily driven are widely used for controlling electric power. As a result of progress and improvements in manufacturing process technology, power IC devices are commercially available which combine on the same chip a power MOSFET with a control circuit for controlling the power MOSFET. Typically, a power block and a control circuit adjoin each other on the chip.

To protect the control circuit from excessive temperatures reached by the power block, which cause malfunction and breakdown of the control circuit, the power IC device should be provided with a protective circuit. One solution has been to mount on the chip a temperature monitor element that feeds temperature information of the power block to the protective circuit. A temperature detector for detecting the temperature of the power MOSFET is disclosed in the Conference Record, IEEE Industrial Application Society Annual Meeting (1986), pp. 429–433. A self-thermal protecting power MOSFET is disclosed in the reprint from SP-737, Sensors and Actuators, 1988, pp. 41–46, with a polysilicon thermal sensing device on the same chip as the MOSFETs.

FIGS. 4a and 4b schematically show configuration and peripheral structure of a temperature monitor element in a prior-art power IC device, where FIG. 4a is a top plan view and FIG. 4b is a sectional view taken along line A—A in FIG. 4a.

FIG. 4a shows an entire planar chip configuration of the power IC device with semiconductor substrate 3. A temperature monitor element 8 is disposed in a control circuit block (IC block) 2, near the boundary between the control circuit block 2 and a power block (power MOSFET block) 1.

FIG. 4b shows an enlarged view of the boundary portion between the power MOSFET block 1 and the IC block 2. Reference numeral 4 designates a back gate region layer (channel region) of an end portion of the power MOSFET block formed on a silicon substrate 3. Reference numeral 5 designates a source region layer in the back gate region layer 4. Reference numeral 6 designates a gate electrode. Reference numeral 7 designates an electrode wiring (source electrode) connected to the source region layer 5 and the back gate region layer 4. Reference numeral 8 designates a temperature monitor element covered by an insulating layer 9 and insulated from the other layers. The temperature monitor element 8 is located in the IC block 2 adjoining the power MOSFET block 1 for monitoring the temperature of the MOSFET block 1.

In FIGS. 4a and 4b, the power MOSFET block 1 is formed as a vertical MOS. Alternatively, the power MOSFET block 1 may be formed as a planar MOS. A drain electrode of the vertical MOS is formed on a back surface of the silicon substrate 3, and a drain electrode of the planar MOS is formed on the same side of the silicon substrate on which the planar MOS is formed. Typically, the power MOSFET block 1 comprises many unit or cell structures arranged in a row each of which comprises the gate electrode 6 formed as a planar grid or a stripe, and the corresponding back gate region layer 4 formed as a polygonal island or a stripe.

If excessive electric power is supplied to the power MOSFET, e.g., when a short circuit occurs in a load of a main circuit, the power MOSFET generates excessive heat. Heat is conducted to the temperature monitor element 8 through the silicon substrate 3 and the insulation layer 9. Temperature information detected by the temperature monitor element 8 is then fed to the protective circuit. When the temperature exceeds a predetermined level, the protective circuit switches the power MOSFET off to protect the power IC device 2.

There is a temperature gradient between the power MOSFET block 1 and the temperature monitor element 8. Temperature at the temperature monitor element 8 is considerably lower than at the power MOSFET block 1 because the temperature monitor element 8 is located on a surface of the IC block that itself generates less heat. Also, an excessive-power condition in the MOSFET block 1 is detected by the temperature monitor element 8 with a considerable time lag due to the heat capacity of the substrate portion between the power MOSFET block 1 and the temperature monitor element 8, and due to the low thermal conductivity of the insulating layer 9. During this time lag, generated excessive heat can cause circuit breakdown.

The prior-art comparison structure of FIG. 3a shows silicon substrate 3, temperature monitor element 8, a back surface at 100° C., and a power MOSFET heat-generative surface portion at 160° C. As shown in FIG. 3b, left-most point, the temperature monitored by the temperature monitor element 8 is lower than the power block temperature by more than 25° C. In case of an accident, e.g., a short circuit fault of the load, with the temperature of the heat generative portion rising by several hundred degrees, the monitored temperature is estimated to be lower by about 100° C.

SUMMARY OF THE INVENTION

More accurate and more responsive temperature monitoring is provided in a semiconductor device comprising an electric power element formed on a semiconductor substrate, and a temperature monitor element formed on the semiconductor substrate for detecting temperature of the power element as it generates heat by supplied electric power. In a preferred embodiment, the temperature monitor element is surrounded in part by the power element. Alternatively or in combination, the temperature monitor element may be covered with an insulating layer which in turn is at least partly covered by a conductive layer integrated with an electrode of the power element.

BRIEF DESCRIPTION OF THE DRAWINGS

FIG. 1a and 1b are schematics of the configuration and peripheral structure of a temperature monitor element in a power IC device in accordance with a preferred first embodiment of the invention, FIG. 1a being a top plan view and FIG. 1b a sectional view taken along line B—B of FIG. 1a.

FIGS. 2a and 2b are schematics of the configuration and peripheral structure of a temperature monitor element in a power IC device in accordance with a preferred second embodiment of the invention, FIG. 2a being a top plan view and FIG. 2b a sectional view taken along line C—C of FIG. 2a.

FIG. 3b is a diagram based on mathematical simulation, of the temperature difference between a power block and a temperature monitor element, for preferred embodiments of the invention and for the comparison structure of FIG. 3a.

FIGS. 4a and 4b are schematics of the configuration and peripheral structure of a temperature monitor element in a prior-art power IC, FIG. 4a being a top plan view and FIG. 4b a sectional view taken along line A—A of FIG. 4a.

DESCRIPTION OF PREFERRED EMBODIMENTS

According to one aspect of the present invention, the temperature monitor element is so formed that the monitor element is partially surrounded by an element driven by supplied electric power. Thus, more heat is transferred, multi-directionally rather than uni-directionally as compared with the prior art. As a result, supplied heat more rapidly raises the temperature of the monitor element to the detection level.

According to another aspect of the present invention, the temperature monitor element is covered with an electrically conductive layer integrated with the electrode of the power element. Thus, heat from the heat generative portion is conducted to the temperature monitor element through the electrically conductive layer which also has high thermal conductivity, as well as through the semiconductor substrate. As a result, supplied heat rapidly raises the temperature of the monitor element to the detection level.

As a benefit of the invention, the temperature difference between the heat generative portion and the temperature monitor element is reduced, with the temperature of the monitor element rising rapidly for quick and accurate monitoring of the temperature of the heat generative portion.

(1) First Embodiment

Figure 1A:
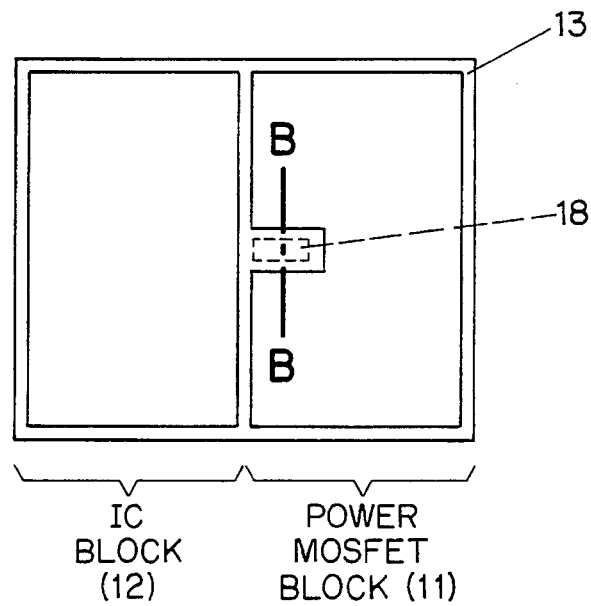

FIG. 1a shows a temperature monitor element 18 on a boundary portion between a power MOSFET block 11 and an IC block (control circuit block) 12. On three sides, the monitor element 18 adjoins the elements of the power MOSFET block 11, and it adjoins the IC block 12 on its fourth side which is used for wiring from the monitor element 18 to a protective circuit in the IC block 12.

Figure 1B:
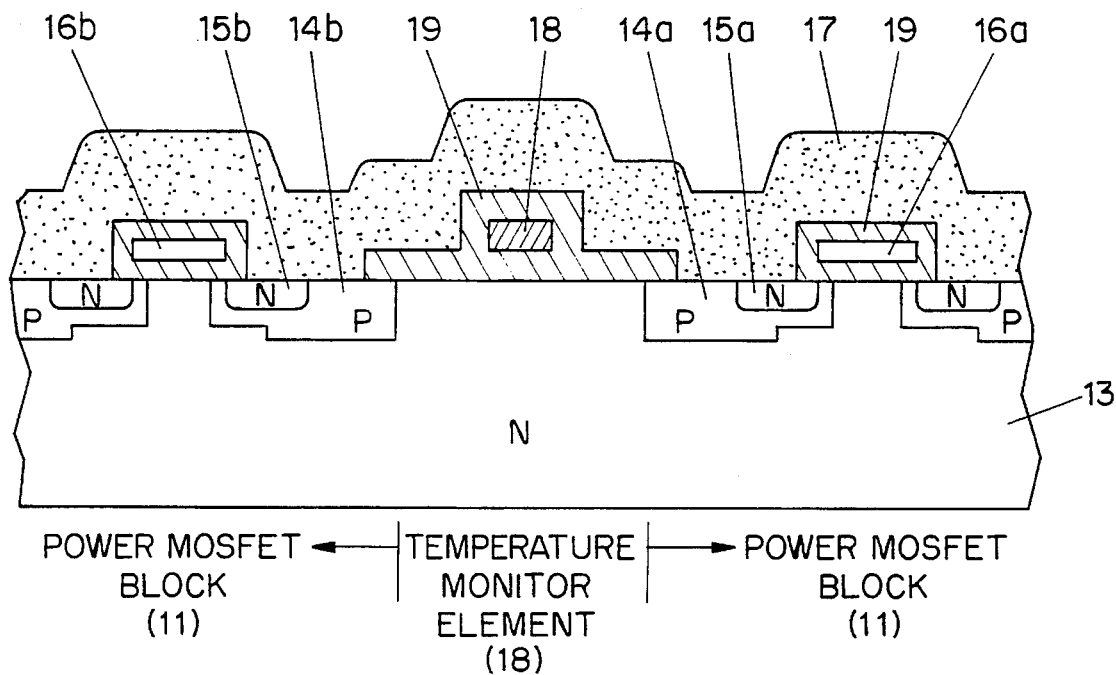

FIG. 1b shows an enlarged view of the boundary portion between the power MOSFET block 11 and the IC block 12. Reference numerals 14a and 14b designate back gate region layers of the power MOSFET formed on a silicon substrate 13 so as to surround the temperature monitor element 18. Reference numerals 15a and 15b designate source region layers in the back gate region layers 14a and 14b. Channel layers comprise the back gate region layers 14a, 14b between the source region layers 15a, 15b under the gate electrodes 16a, 16b and the silicon substrate 13. Reference numeral 17 designates a source electrode, preferably made of a material of high thermal conductivity, e.g., aluminum, interconnecting the back gate region layers 14a, 14b and the source region layers 15a, 15b. Reference numeral 18 designates a temperature monitor element for detecting the temperature of the heat generative power MOSFET. The temperature monitor element may utilize a reverse leakage current through a PN-junction. The temperature monitor element 18 is covered with an insulating layer 19, e.g., made of silicon oxide, and is insulated from the other elements. The source electrode 17 extends on the insulating layer 19 over the temperature monitor element 18, covering the monitor element 18.

In the power IC device described above, the channel layers are formed when negative voltage is applied between the gate electrodes 16a and 16b, and a normal current flows through the source electrode 17, source region layers 15a, 15b, the channel layers and the silicon substrate 13. In this case, heat is generated mainly from the channel layers.

In case of an accident, an excessive current may flow through the source region layers 15a, 15b, the back gate region layers 14a, 14b, and the silicon substrate 13. In this case, excessive heat may be generated mainly from the PN-junctions between the source region layers 15a, 15b, and the back gate region layers 14a, 14b, or from the PN-junctions between the back gate region layers 14a, 14b, and the silicon substrate 13. The excessive heat is conducted across three sides of the temperature monitor element to the temperature monitor element 18 through the silicon substrate 13 and the source electrode 17, and detected by the monitor element 18.

The temperature information from the temperature monitor element 18 is then sent to the protective circuit of the IC block 12, wherein the protective circuit stops operation of the power MOSFET by disconnecting a power supply from the power MOSFET.

Figure 3A:
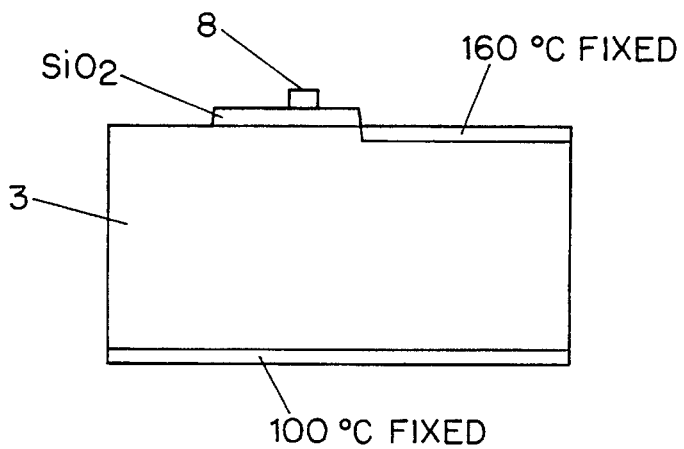
FIG. 3a is a schematic side view of a prior-art power IC device structure as referred to for comparison in FIG. 3b, left-most point.
Figure 3B:
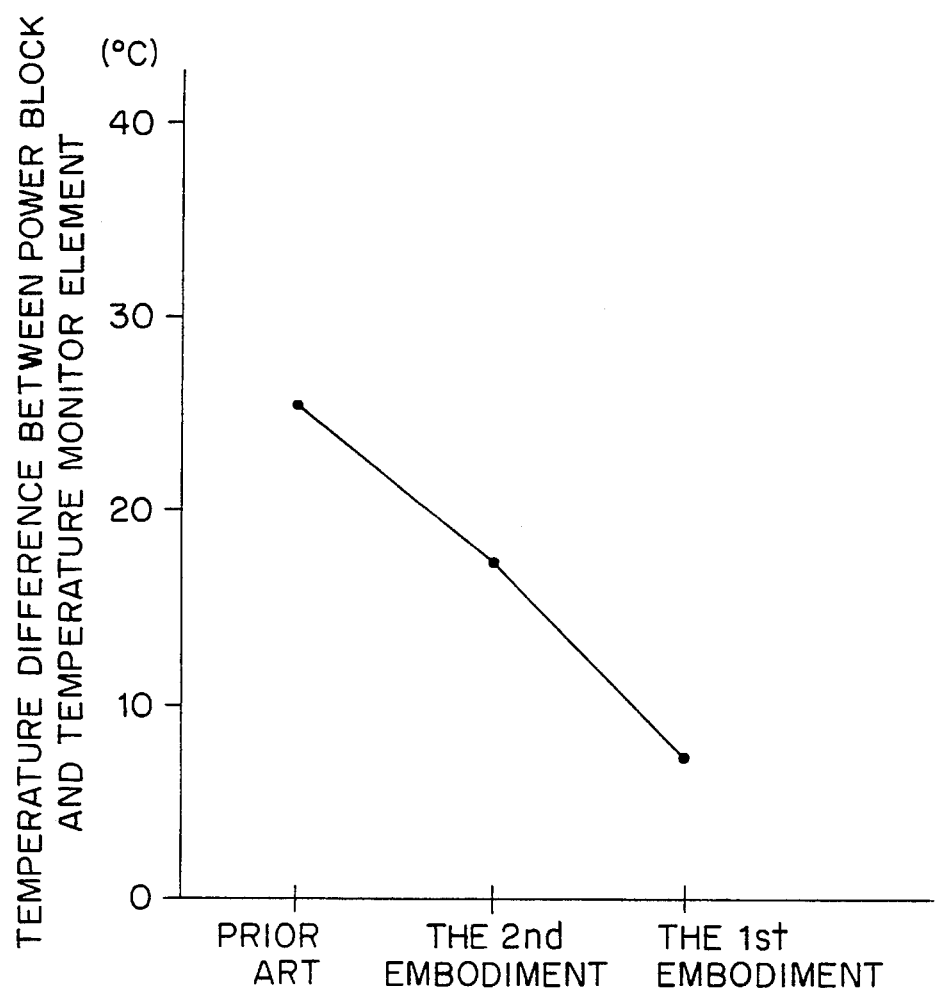
Figure 4A:
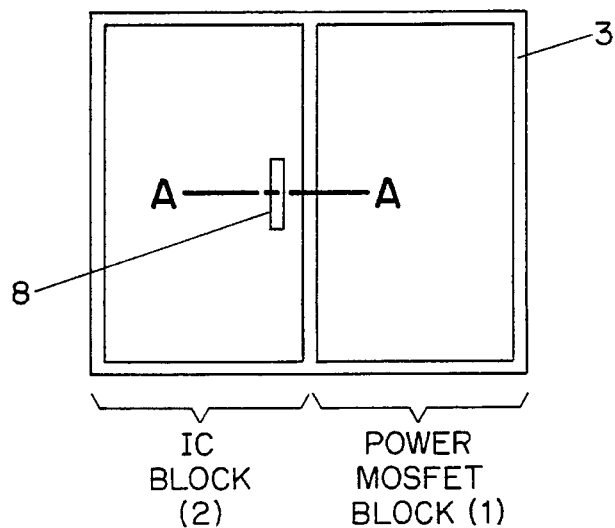
Figure 4B:
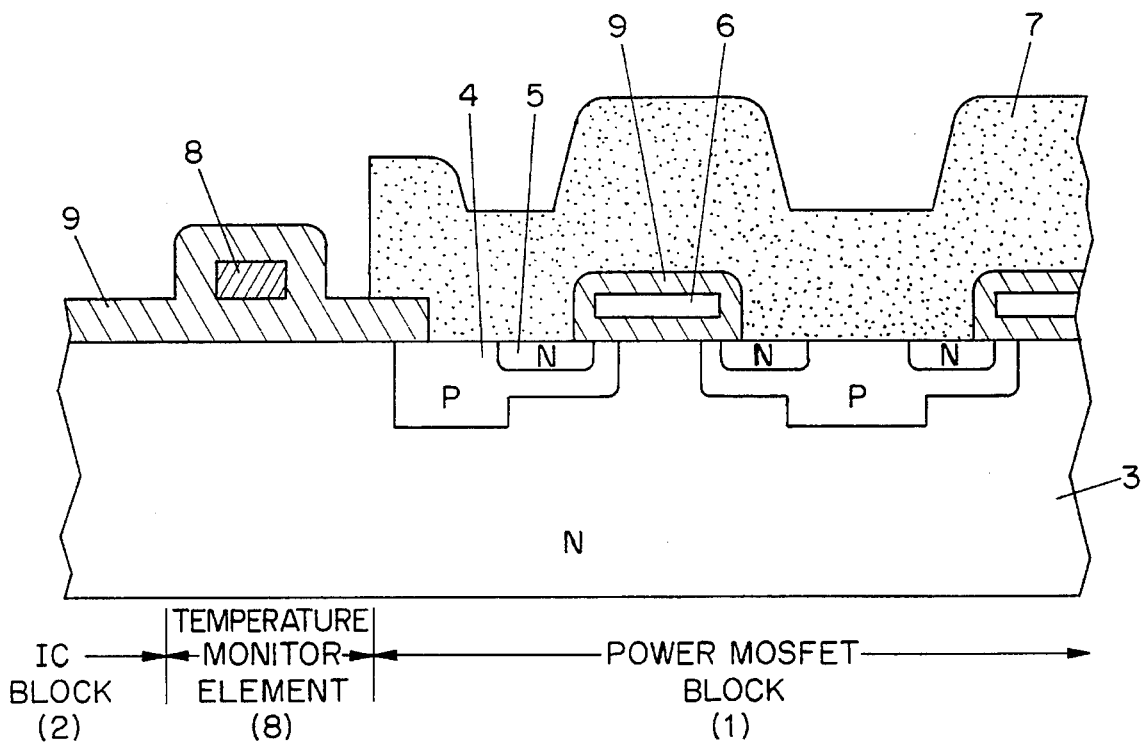

To confirm temperature detection accuracy in the first embodiment, a computer simulation was conducted with a corresponding mathematical model. The temperature difference between the heat generative portion and the temperature monitor element obtained from the simulation is graphically shown in FIG. 3b, right-most point, for heat generated from a surface layer of the silicon substrate spaced 70 μm from the monitor element 18, a thickness of the silicon substrate of 500 μm, a temperature of the heat generative portion of 160° C., and a temperature of the back surface of 100° C. The temperature difference is less than 10° C. in this case.

As described above, because the temperature monitor element is surrounded on three sides by the heat generative portion of the power MOSFET in the power IC device, more heat is transferred across the three sides to the temperature monitor element. Additionally, because the source electrode 17 is made of a highly conductive material and extends over the insulating layer 19, heat from the heat generative portion is conducted to the temperature monitor element through the source electrode 17 as well as the silicon substrate 13. Thus, sufficient heat is supplied to the temperature monitor element for quick and accurate detection of the temperature of the power MOSFET block 11.

(2) Second Embodiment

Figure 2A:
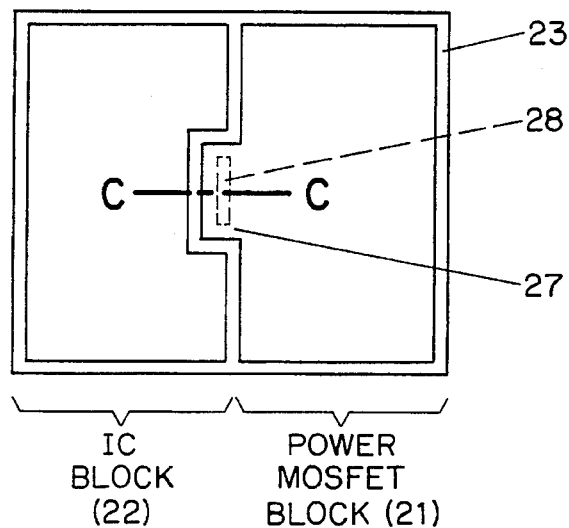

FIG. 2a shows an entire planar chip configuration of the power IC device with semiconductor substrate 23, with a temperature monitor element 28 on a boundary portion between a power MOSFET block 21 and an IC block 22.

Figure 2B:
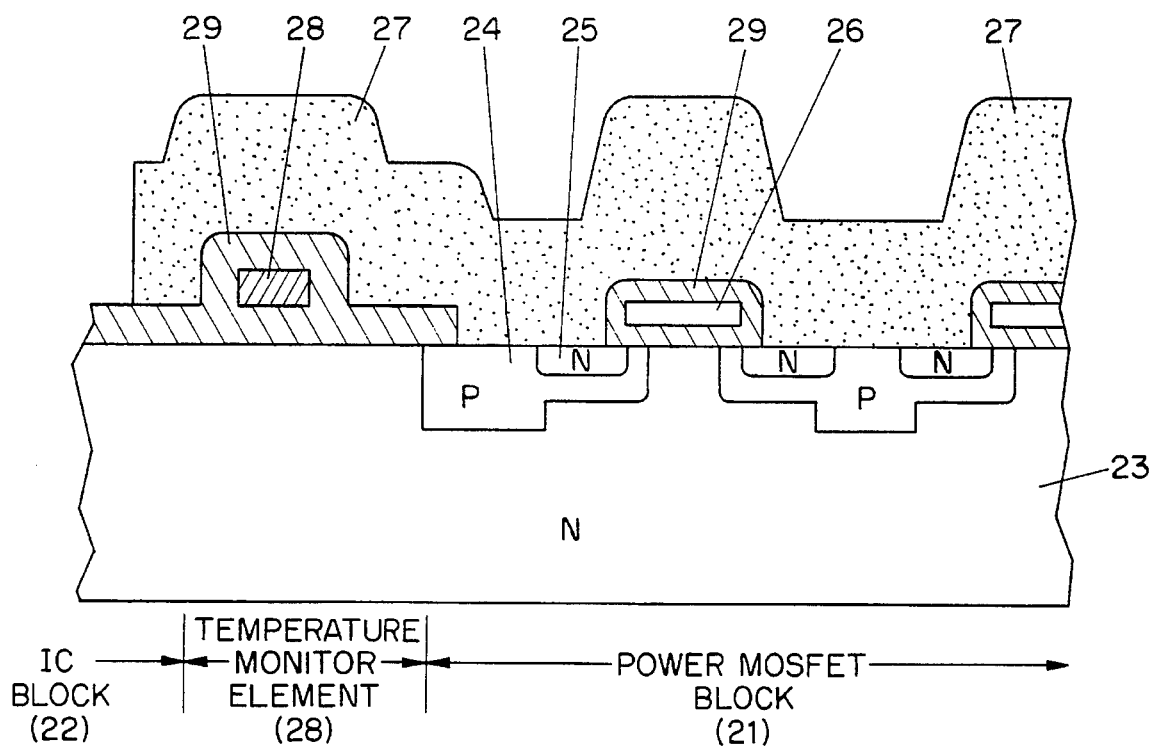

FIG. 2b shows an enlarged view of the boundary portion between the power MOSFET block 21 and the IC block 22. The power MOSFET is disposed in close proximity to the temperature monitor element 28 on a side of the monitor element, and differs from the prior art in that the source electrode 27 of the power MOSFET extends on the insulating layer 29 over the temperature monitor element 28. Reference numeral 24 designates a back gate region layer of the power MOSFET formed on the silicon substrate 23 in close proximity to the temperature monitor element 28. Reference numeral 25 designates a source region layer in the back gate region layers 24. A channel layer comprises the back gate region layer 24 between the source region layer 25 under a gate electrode 26 and the silicon substrate 23. Reference numeral 27 designates a source electrode, preferably made of a material of high thermal conductivity, connecting between the back gate region layer 24 and the source region layer 25. Reference numeral 28 designates the temperature monitor element covered with the insulating layer 29 and insulated from the other elements. The source electrode 27 extends on the insulating layer 29 over the temperature monitor element 28, covering the temperature monitor element 28.

In case of accident in the power IC device described above, an excessive current may flow through the source region layer 25, the back gate region layer 24, and the silicon substrate 23. In this case, excessive heat may be generated mainly from the PN-junctions between the source region layer 25 and the back gate region layer 24, or from the PN-junction between the back gate region layer 24 and the silicon substrate 23. The excessive heat is conducted to the temperature monitor element 28 through the silicon substrate 23 and the source electrode 27, and detected by the monitor element 28. The temperature information from the temperature monitor element 28 is sent to the protective circuit of the IC block 22, and the protective circuit stops operation of the power MOSFET by disconnecting a power supply from the power MOSFET.

To confirm temperature detection accuracy in the second embodiment, a computer simulation was conducted with a corresponding mathematical model. The temperature difference between the heat generative portion and the temperature monitor element obtained from the simulation is graphically shown in FIG. 3b, middle point, for heat generated from a surface layer of the silicon substrate spaced 70 μm from the monitor element 28, a thickness of the silicon substrate of 500 μm, a temperature of the heat generative portion of 160° C., and a temperature of the back surface of 100° C. The temperature difference is less than 17° C. in this case.

Thus, the temperature monitor element 28 monitors the temperature of the power MOSFET block 21 more accurately than the prior art. The protective circuit protects the MOSFET and its control circuit against breakdown based on the temperature information from the monitor element.

(3) Third Embodiment

In a third embodiment of the invention, the source electrode 17 does not extend over the temperature monitor element 18. But, as illustrated by FIG. 1a, the temperature monitor element 18 is surrounded on three of its sides by the power MOSFET block. Sufficient heat for abnormality detection is transferred to the temperature monitor element.

It will be understood that the invention is not limited to the embodiments described and illustrated herein as they have been given only as examples of the invention. Without going beyond the scope of the invention, certain arrangements may be changed or certain means may be replaced by equivalent means. For example, though preferred embodiments of the invention are described for vertical MOSFET structure, the invention is applicable to a power IC incorporating a planar MOSFET or a thyristor.

I claim:

1. A semiconductor device comprising:

a semiconductor substrate;

a power element on the semiconductor substrate;

a temperature monitor element on the semiconductor substrate, disposed for monitoring temperature of the power element; and an IC element on the semiconductor substrate for controlling the power element according to the monitored temperature of the power element;

wherein the temperature monitor element is surrounded by the power element on three sides of a planar layout.

2. The semiconductor device of claim 1, further comprising an insulating layer on the temperature monitor element, and the power element having an electrode with an integrated, thermally conductive extension on the insulating layer over at least a portion of the temperature monitor element.

3. The semiconductor device of claim 2, wherein the electrode and the thermally conductive extension consist essentially of aluminum.

4. A semiconductor device comprising:

a semiconductor substrate;

a power element on the semiconductor substrate, having an electrode;

a temperature monitor element on the semiconductor substrate, disposed for monitoring temperature of the power element;

an insulating layer on the temperature monitor element; and an IC element on the semiconductor substrate for controlling the power element according to the monitored temperature of the power element;

wherein the electrode of the power element has an integrated, thermally conductive extension on the insulating layer over at least a portion of the temperature monitor element.

5. The semiconductor device of claim 4, wherein the electrode and the extension consist essentially of aluminum.

6. The semiconductor device of claim 4, wherein the temperature monitor element is surrounded in part by the power element.

7. The semiconductor device of claim 6, wherein the temperature monitor element is surrounded by the power element on three sides in a planar layout.

8. The semiconductor device of claim 1, further comprising an insulating layer on the temperature monitor element, and the power element having an electrode with an integrated, thermally conductive extension on the insulating layer covering the temperature monitor element completely.

9. The semiconductor device of claim 4, wherein the integrated, thermally conductive extension on the insulating layer covers the temperature monitor element completely.

* * * * *

UNITED STATES PATENT AND TRADEMARK OFFICE
CERTIFICATE OF CORRECTION

PATENT NO. : 5,521,421
DATED : May 28, 1996
INVENTOR(S) : Shoichi Furuhata

It is certified that error appears in the above-indentified patent and that said Letters Patent is hereby corrected as shown below:

Title page, Item 73, "Hino" should read --Tokyo--;

Title page, Item 56, between 4th and 5th lines, insert:
```
--0224274  6/1987   European Patent Office
  6447077  2/1989   Japan
  2210501  6/1989   Great Britain
  2261321  5/1993   Great Britain
```

Signed and Sealed this

Twenty-second Day of October, 1996

Attest:

BRUCE LEHMAN

*Attesting Officer*     *Commissioner of Patents and Trademarks*